(12) United States Patent
Ahamed et al.

(10) Patent No.: US 11,524,392 B2
(45) Date of Patent: Dec. 13, 2022

(54) MINIMAL CONTACT GRIPPING OF THIN OPTICAL DEVICES

(71) Applicant: Applied Materials, Inc., Santa Clara, CA (US)

(72) Inventors: Yaseer Arafath Ahamed, Santa Clara, CA (US); Kangkang Wang, San Jose, CA (US); Benjamin B. Riordon, Newburyport, MA (US); James D. Strassner, Austin, TX (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/237,533

(22) Filed: Apr. 22, 2021

(65) Prior Publication Data
US 2022/0161396 A1 May 26, 2022

Related U.S. Application Data

(60) Provisional application No. 63/117,571, filed on Nov. 24, 2020.

(51) Int. Cl.
*B25B 11/00* (2006.01)
*G02B 6/10* (2006.01)
*G02B 1/00* (2006.01)

(52) U.S. Cl.
CPC ............ *B25B 11/005* (2013.01); *G02B 1/002* (2013.01); *G02B 6/10* (2013.01)

(58) Field of Classification Search
CPC ..... B25B 11/00; B25B 11/005; B25B 11/007; B23Q 3/08; B23Q 3/088; H01L 21/6838; G02B 1/002; G02B 6/10
(Continued)

(56) References Cited

U.S. PATENT DOCUMENTS 6,152,507 A    11/2000   Pirker
6,203,621 B1 *   3/2001   Tran ...................... B25B 11/005
                                                                    118/715
(Continued)

FOREIGN PATENT DOCUMENTS

CN        210307882 U     4/2020
JP         H06204324 A     7/1994
(Continued)

OTHER PUBLICATIONS

PCT Notification of Transmittal of the International Search Report and the Written Opinion of the International Searching Authority for International Application No. PCT/US2021/057574; dated Feb. 18, 2022.

*Primary Examiner* — Lee D Wilson
*Assistant Examiner* — Alberto Saenz
(74) *Attorney, Agent, or Firm* — Patterson + Sheridan, LLP

(57) ABSTRACT

Embodiments described herein provide for devices and methods for retaining optical devices. The devices and methods described herein provide for retention of the substrate without contacting sensitive portions of the substrate. The devices and methods utilize retention pads or vacuum pins to contact the exclusion zones i.e., inactive areas of the substrate to retain the substrate and prevent the substrate from moving laterally. Additionally, a holding force retains the substrate in the vertical direction, without contacting the substrate. The methods provide for adjusting the devices to account for multiple geometries of the substrate. The methods further provide for adjusting the devices, such as adjusting a gap between the optical device and a suction pad, to alter the holding force of the devices on the optical devices.

16 Claims, 6 Drawing Sheets

(58) Field of Classification Search
USPC ............. 29/559; 269/20, 21, 289 r, 900, 903
See application file for complete search history.

(56) References Cited

U.S. PATENT DOCUMENTS

| | | | |
|---|---|---|---|
| 8,960,686 B2 * | 2/2015 | Ferguson | ............... B23Q 3/088 |
| | | | 279/3 |
| 10,559,488 B2 * | 2/2020 | Breingan | .......... H01L 21/02052 |
| 10,811,299 B2 * | 10/2020 | LaBrie | ................... H01L 21/68 |
| 2017/0256436 A1 | 9/2017 | Rashkovsky et al. | |
| 2019/0148189 A1 * | 5/2019 | Huang | .............. H01L 21/67259 |
| | | | 29/739 |
| 2019/0247983 A1 * | 8/2019 | Borowicz | ............ B65G 47/917 |
| 2019/0252235 A1 * | 8/2019 | Thirunavukarasu | ........................ |
| | | | H01L 21/68771 |

FOREIGN PATENT DOCUMENTS

| | | |
|---|---|---|
| JP | 2003128279 A | 5/2003 |
| JP | 2003158169 A | 5/2003 |
| JP | 2012000737 A | 1/2012 |

\* cited by examiner

MINIMAL CONTACT GRIPPING OF THIN OPTICAL DEVICES

CROSS-REFERENCE TO RELATED APPLICATIONS

This application claims priority from U.S. Application Ser. No. 63/117,571, filed Nov. 24, 2020, which is hereby incorporated by reference in its entirety.

BACKGROUND

Field

Embodiments of the present disclosure generally relate to optical devices. More specifically, embodiments described herein relate to devices and methods for retaining optical devices.

Description of the Related Art

Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment.

The optical devices generally include structures disposed on the optical devices. The optical devices and structures are formed from thin, brittle materials that may be damaged when exposed to external stresses or external contaminants. Additionally, some coatings applied over the structures are sensitive and may be damaged during handling. Thus, optical devices are susceptible to damage when transferring the optical devices between different processing tools. Retaining, e.g., gripping, the optical device without damaging, deflecting, or leaving marks and residue on the optical devices is difficult. Additionally, it is desirable to retain different contours of optical devices with a single device. Accordingly, what is needed in the art are devices and methods for retaining optical devices.

SUMMARY

In one embodiment a device is provided. The device includes a base plate. The base plate is coupled to a stem. The device further includes a suction pad disposed on the stem. The suction pad is operable to provide a holding force to a substrate to be retained. The device further includes a plurality of arms extending radially from the stem and the suction pad. The plurality of arms are coupled to a plurality of actuators. The actuators are operable to extend the plurality of arms in a lateral direction or a vertical direction. The device further includes a retention pad disposed on each of the plurality of arms.

In another embodiment, a device is provided. The device includes a base plate. The device further includes a ledge disposed along a perimeter of the device. The perimeter has a shape corresponding to a substrate to be retained on the ledge. The base plate is recessed from the ledge. The device further includes a plurality of vacuum pins disposed on the ledge. The plurality of vacuum pins are coupled to a vacuum source. The plurality of vacuum pins are operable to provide a vacuum force to the substrate disposed on the ledge when the substrate is retained.

In yet another embodiment, a method for retaining a substrate is provided. The method includes adjusting retention pads disposed on a plurality of arms of a retaining device. The retention pads define a retention area corresponding to a surface area of the substrate to be retained. The plurality of arms are disposed radially from a suction pad and the suction pad is operable to provide a holding force to the substrate. The method further includes adjusting a gap between the suction pad and the substrate to be retained. The method further includes activating the suction pad to provide the holding force to the substrate to be retained.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein relate to devices and methods for retaining optical devices. In one embodiment, the device for retaining optical devices includes a base coupled to a stem. A suction pad disposed on the stem and the suction pad is operable to provide a holding force to a substrate to be retained by the device. A plurality of arms extending radially from the stem and the suction pad and the plurality of arms are coupled to a plurality of actuators operable to extend the plurality of arms in a lateral direction or a vertical direction. Retention pads are disposed on each of the plurality of arms.

In another embodiment, the device for retaining optical devices includes a base plate. The device further includes a ledge disposed along a perimeter of the device having a shape corresponding to a substrate to be retained on the ledge. The base plate is recessed from the ledge. A plurality of vacuum pins are disposed on the ledge and coupled to a vacuum source. The plurality of vacuum pins are operable to provide a vacuum force to the substrate disposed on the ledge when the substrate is retained.

Figure 1A:
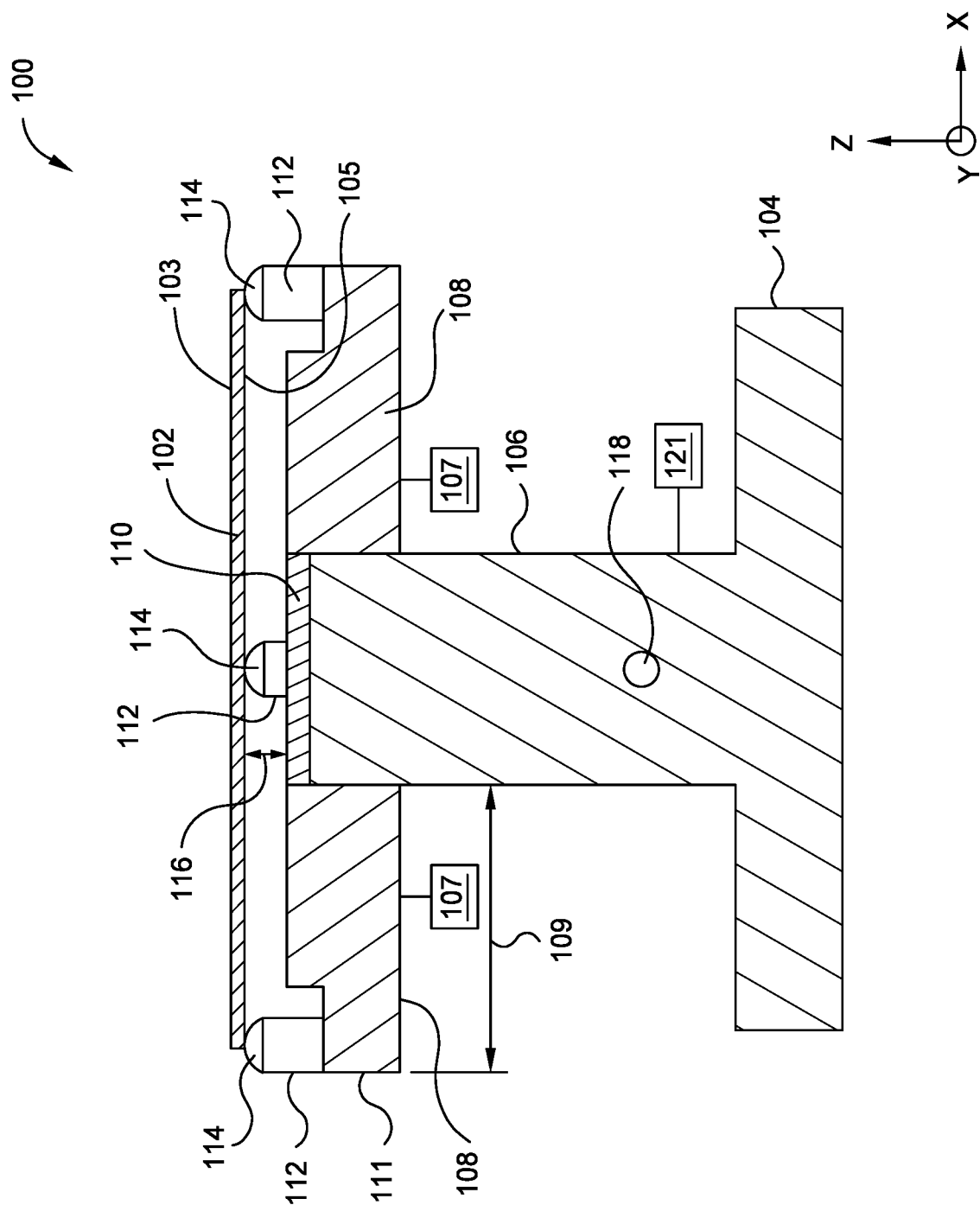
FIG. 1A is schematic, cross-sectional view of a retaining device according to embodiments.

FIG. 1A is a schematic, cross-sectional view of a retaining device 100 according to embodiments described herein. The retaining device 100 is operable to retain a substrate 102. The retaining device 100 is operable to transfer and handle the substrate 102. Additionally, the retaining device 100 is operable to retain the substrate 102 during processing.

The substrate 102 can be any substrate used in the art, and can be either opaque or transparent depending on the use of the substrate. Additionally, substrate selection may further include varying shapes, thickness, and diameters of the substrate 102. In one embodiment, which can be combined with other embodiments described herein, the substrate 102 includes, but is not limited to, a glass, silicon carbide, or combinations thereof. In another embodiment, which can be combined with other embodiments described herein, the substrate 102 is a waveguide combiner or a flat optical device, such as a metasurface. In yet another embodiment, which can be combined with other embodiments described herein, the substrate 102 may have optical device structures patterned on a first surface 103 or a second surface 105 of the substrate 102.

The retaining device 100 includes a base plate 104, a stem 106, a suction pad 110, a plurality of arms 108, and retention pads 112. In one embodiment, which can be combined with other embodiments described herein, the base plate 104 is coupled to a surface of a device, such as a transfer robot. In another embodiment, which can be combined with other embodiments described herein, the base plate 104 is configured to be a handle. For example, the base plate 104 may be configured as a handle for manual use of the retaining device 100. The base plate 104 is coupled to a stem 106. The stem 106 supports a plurality of arms 108. The plurality of arms 108 are coupled to the stem 106 and are radially disposed around the stem 106.

The plurality of arms 108 each include a retention pad 112. The retention pads 112 are configured to retain the substrate 102. In one embodiment, which can be combined with other embodiments described herein, the substrate 102 is an optical device lens having a surface area of between about 18 cm$^2$ and about 20 cm$^2$. The retaining device 100 has a retention area defined by the retention pads 112. The retention area corresponds to the surface area of the optical device lens, such that the optical device lens is retained by the retaining device 100.

Figure 1B:
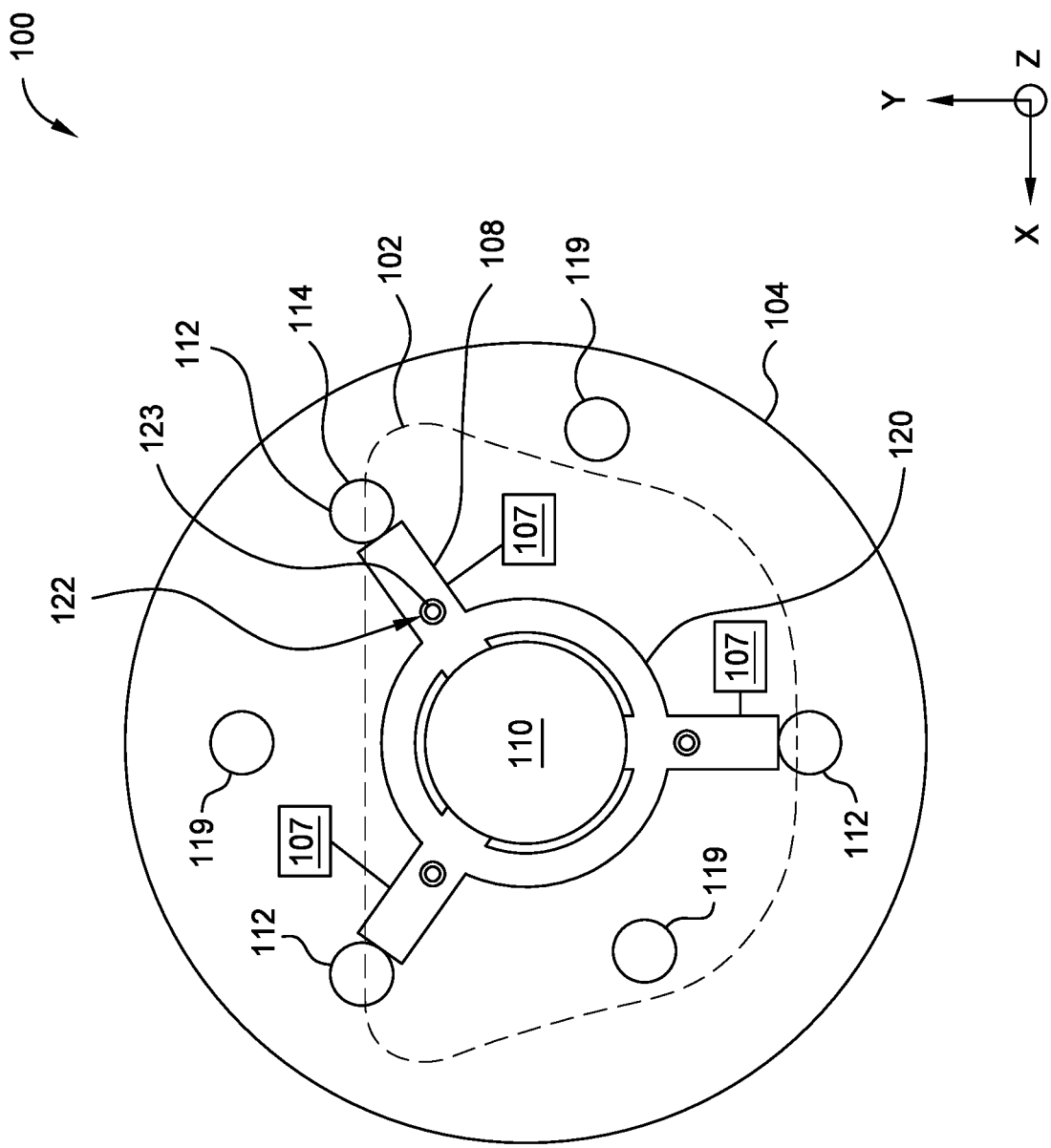
FIG. 1B is a schematic, top view of a retaining device according to embodiments.
Figure 3A:
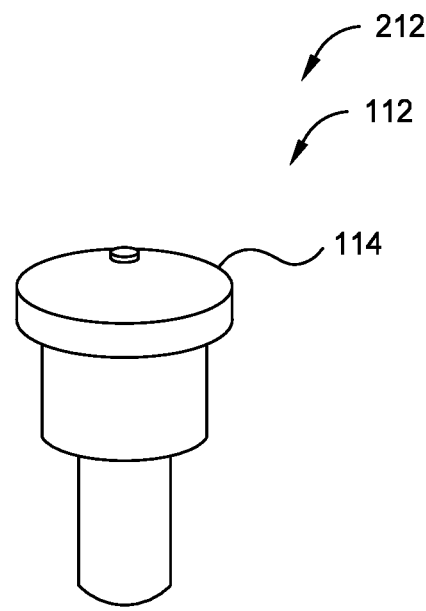
FIG. 3A is a schematic, perspective view of a retention pad according to embodiments.
Figure 3B:
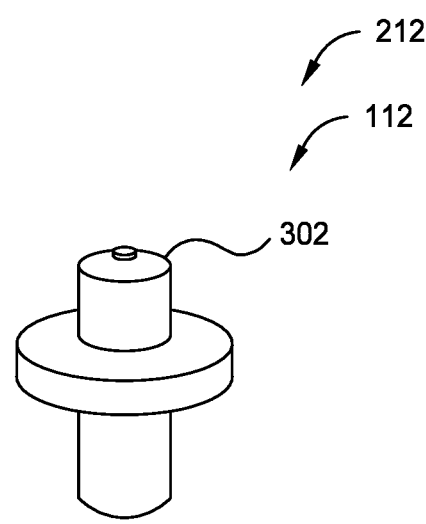
FIG. 3B is a schematic, perspective view of a retention pad according to embodiments.

The retention pads 112 utilize corner contact or contact on exclusion zones of the substrate 102 i.e., inactive zones of the substrate 102. Therefore, sensitive portions of the substrate 102, such as the optical device structures and coatings, are not damaged during transfer or during handling. As shown in FIGS. 3A and 3B, the retention pads 112 may be configured to include one of a contact pad 114 (shown in FIG. 1A) or a vacuum pad 302. Although only three retention pads 112 are shown in FIGS. 1A and 1B, any number of retention pads 112 may be utilized to retain the substrate 102. Additionally, any number of the plurality of arms 108 may be utilized to support the retention pads 112.

The stem 106 supports the suction pad 110. The suction pad 110 provides suction to the substrate 102 without physically contacting the substrate 102. In one embodiment, which can be combined with other embodiments described herein, the suction pad 110 may utilize Bernoulli's principle to create a holding force on the substrate 102. While the force from the suction pad 110 retains the substrate 102 in a vertical direction i.e., the Z-direction, the retention pads 112 prevent the substrate 102 from lateral movement i.e., movement in the X-direction. The stem 106 may further include an inlet 118. The inlet 118 provides air or removes air from the suction pad 110 from an external air source 121 or from an external vacuum source 121 to enable the production of a holding force. The suction pad 110 may be any device operable to provide a holding force to the substrate 102 without contacting the substrate 102.

In one embodiment, which can be combined with other embodiments described herein, the plurality of arms 108 may include actuators 107. Each arm 108 of the plurality of arms 108 may include an actuator 107. The actuators 107 in the plurality of arms can adjust a radial distance 109. The radial distance 109 is the length the plurality of arms 108 extends from the stem 106 i.e., the length from the stem 106 to an outer edge 111 of the plurality of arms 108. The radial distance 109 of the plurality of arms 108 may be adjusted based on the geometry of the substrate 102. Additionally, the radial distance 109 of the plurality of arms 108 may be adjusted based on the location of the exclusion zones on the substrate 102. The actuators 107 may be micro-actuators. In another embodiment, which can be combined with other embodiments described herein, the plurality of arms 108 including the actuators 107 can be adjusted vertically i.e., the Z-direction. The actuators 107 in the plurality of arms 108 can adjust a gap 116. The gap 116 is the length from the suction pad 110 to the second surface 105 of the substrate 102. As the gap 116 decreases, the strength of the holding force on the substrate 102 increases. The gap 116 may be adjusted to ensure there is no deflection of the substrate 102.

FIG. 1B is a schematic, top view of the retaining device 100. The retaining device 100 includes the base plate 104, the stem 106, the suction pad 110, the plurality of arms 108, and the retention pads 112. In one embodiment, which can be combined with other embodiments described herein, the base plate 104 can be coupled to a surface via a plurality of through holes 119. For example, the plurality of through holes 119 allow the retaining device 100 to be coupled to a device operable to transfer and handle the substrate 102, such as a transfer robot.

In one embodiment, which can be combined with other embodiments described herein, the retaining device 100 includes a light source 120. The light source 120 is coupled to the retaining device 100. The light source 120 may provide light for additional processing of the substrate 102. For example, the light source 120 may provide light for a curing process, such as by providing ultraviolet light to the substrate 102. The light source 120 may be utilized to provide lighting to the surrounding environment of the retaining device 100. In another embodiment, which can be combined with other embodiments described herein, the light source 120 is a ring light i.e., the light source 120 is a ring shape such that light is provided equally or substantially equally to the substrate 102.

In one embodiment, which can be combined with other embodiments described herein, the retaining device 100 includes a visual system 122. The visual system 122 includes a plurality of ports 123 disposed on the plurality of arms 108. The plurality of ports 123 are operable to house one or more devices such as one or more cameras or sensors. The visual system 122 may include a controller coupled to the plurality of ports 123. The controller may then facilitate operations of handling and transferring the substrate 102 utilizing the visual system 122. The one or more cameras housed in the plurality of ports 123 are operable to assist in metrology processes and to improve the positional accuracy when positioning the retention pads 112 around the substrate 102. The one or more sensors housed in the plurality of ports may be proximity sensors and are operable to communicate with the controller. For example, a sensor may communicate to the controller when the substrate 102 is retained by the retaining device 100. Although FIG. 1B shows the visual system 122 with three of the plurality of ports 123, one or more of the plurality of ports 123 may be utilized. Any number of devices such as the one or more cameras and sensors may be utilized with the retaining device 100. Additionally, the plurality of ports 123 may be disposed on other portions of the retaining device 100, and are not limited to being disposed on the plurality of arms 108.

Figure 2A:
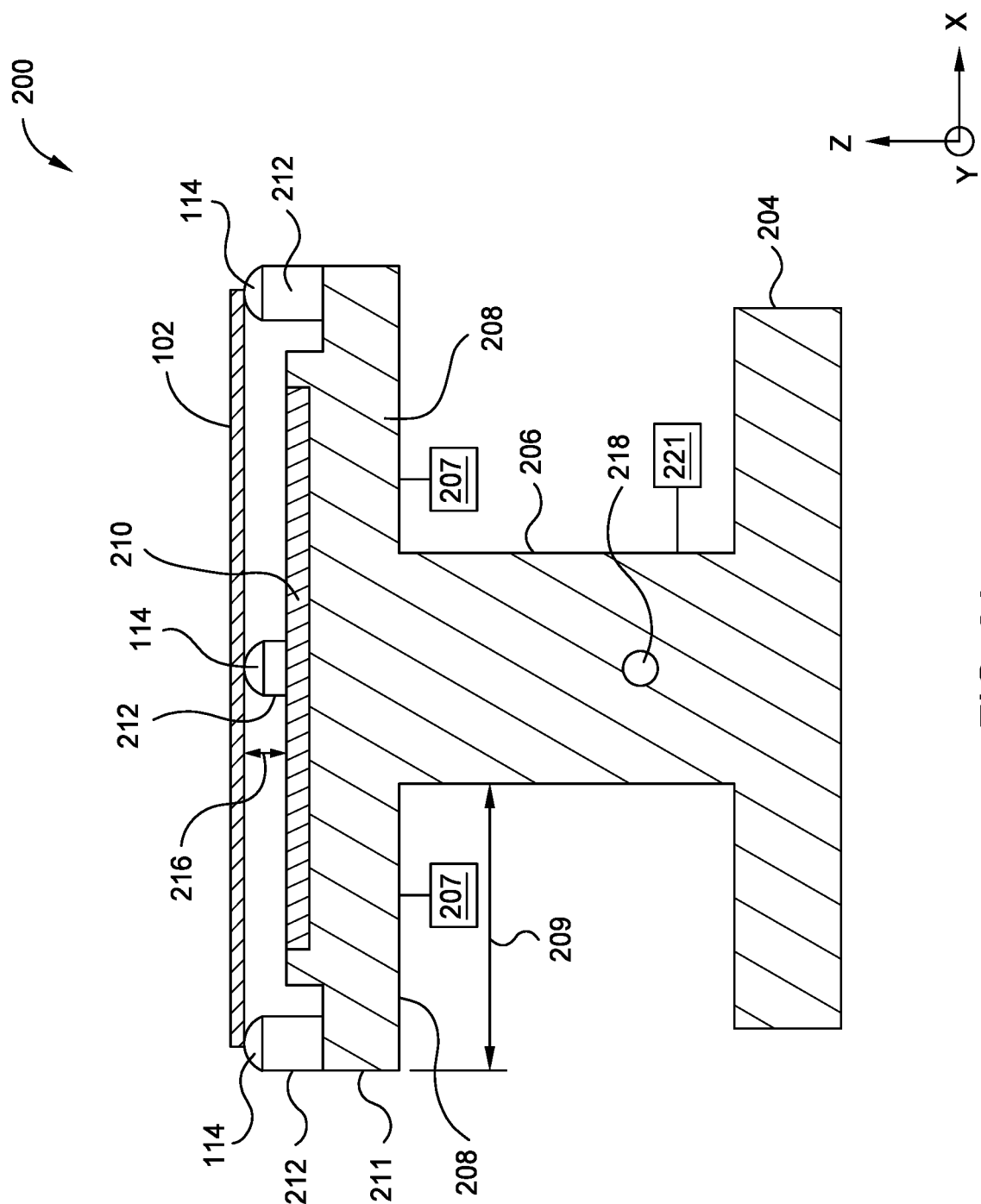
FIG. 2A is schematic, cross-sectional view of a retaining device according to embodiments.

FIG. 2A is a schematic, cross-sectional view of a retaining device 200 according to embodiments described herein. The retaining device 200 is operable to retain a substrate 102. The retaining device 200 is operable to transfer and handle the substrate 102. Additionally, the retaining device 200 is operable to retain the substrate 102 during processing.

The substrate 102 can be any substrate used in the art, and can be either opaque or transparent depending on the use of the substrate. Additionally, substrate selection may further include varying shapes, thickness, and diameters of the substrate 102. In one embodiment, which can be combined with other embodiments described herein, the substrate 102 includes, but is not limited to, a glass, silicon carbide, or combinations thereof. In another embodiment, which can be combined with other embodiments described herein, the substrate 102 is a waveguide combiner or a flat optical device, such as a metasurface. In yet another embodiment, which can be combined with other embodiments described herein, the substrate 102 can have optical device structures patterned on a first surface 103 or a second surface 105.

The retaining device 200 includes a base plate 204, a stem 206, a suction pad 210, a plurality of arms 208, and retention pads 212. In one embodiment, which can be combined with other embodiments described herein, the base plate 204 is coupled to a surface of a device, such as a transfer robot. In another embodiment, which can be combined with other embodiments described herein, the base plate 204 is configured to be a handle. For example, the base plate 204 may be configured as a handle for manual use of the retaining device 200. The base plate 204 is coupled to a stem 206. The stem 206 supports a plurality of arms 208. The plurality of arms 208 are coupled to the stem 206 and are radially disposed around the stem 206.

The plurality of arms 208 each include a retention pad 212. The retention pads 212 are configured to retain the substrate 102. In one embodiment, which can be combined with other embodiments described herein, the substrate 102 is an optical device lens having a surface area of between about 18 cm$^2$ and about 20 cm$^2$. The retaining device 200 has a retention area defined by the retention pads 212. The retention area corresponds to the surface area of the optical device lens, such that the optical device lens is retained by the retaining device 200.

Figure 2B:
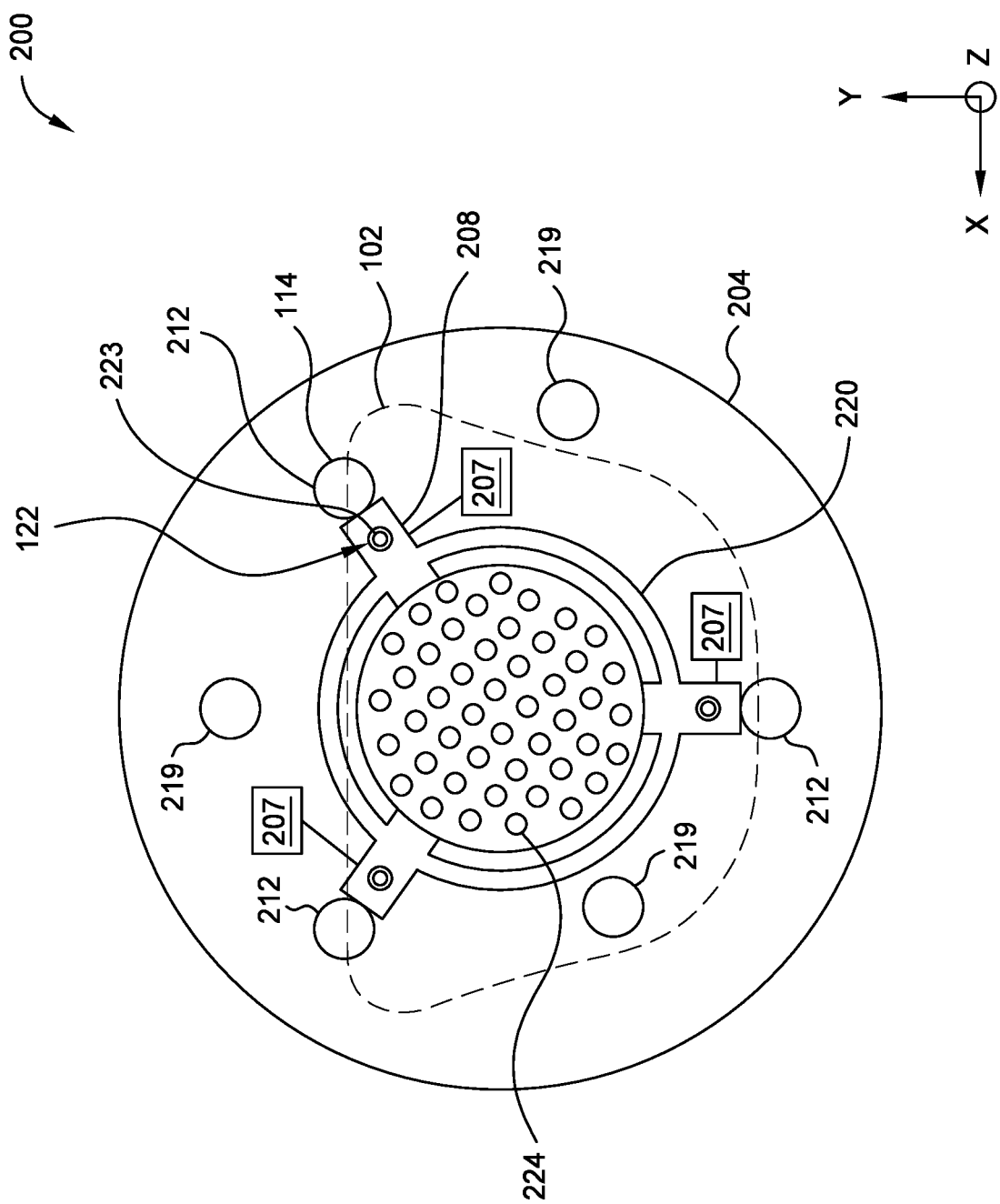
FIG. 2B is a schematic, top view of a retaining device according to embodiments.

The retention pads 212 utilize corner contact or contact on exclusion zones of the substrate 102 i.e., inactive zones of the substrate 102. Therefore, sensitive portions of the substrate 102, such as the optical device structures and coatings, are not damaged during transfer or during handling. As shown in FIGS. 3A and 3B, the retention pads 212 may be configured to include one of a contact pad 114 (shown in FIG. 2A) or a vacuum pad 302. Although only three retention pads 212 are shown in FIGS. 2A and 2B, any number of retention pads 212 may be utilized to retain the substrate 102. Additionally, any number of the plurality of arms 208 may be utilized to support the retention pads 212.

The stem 106 supports the suction pad 210. The suction pad 210 provides suction to the substrate 102 without physically contacting the substrate 102. In one embodiment, which can be combined with other embodiments described herein, the suction pad 210 may utilize the Coandă effect to create a holding force on the substrate 102. While the force from the suction pad 210 retains the substrate 102 in a vertical direction i.e., the Z-direction, the retention pads 212 prevent the substrate 102 from lateral movement i.e., movement in the X-direction. The stem 206 may further include an inlet 218. The inlet 218 provides air or removes air from the suction pad 210 from an external air source 221 or from an external vacuum source 221 to enable the production of a holding force. The suction pad 210 may be any device operable to provide a holding force to the substrate 102 without contacting the substrate 102.

In one embodiment, which can be combined with other embodiments described herein, the plurality of arms 208 may include actuators 207. Each arm 208 of the plurality of arms 208 may include an actuator 207. The actuators 207 in the plurality of arms can adjust a radial distance 209. The radial distance 209 is the length the plurality of arms 208 extends from the stem 206 i.e., the length from the stem 206 to an outer edge 211 of the plurality of arms 208. The radial distance 209 of the plurality of arms 208 may be adjusted based on the geometry of the substrate 102. Additionally, the radial distance 209 of the plurality of arms 208 may be adjusted based on the location of the exclusion zones on the substrate 102. The actuators 207 may be micro-actuators. In another embodiment, which can be combined with other embodiments described herein, the plurality of arms 108 including the actuators 207 can be adjusted vertically i.e., the Z-direction. The actuators 207 in the plurality of arms 208 can adjust a gap 216. The gap 216 is the length from the suction pad 210 to the second surface 105 of the substrate 102. As the gap 216 decreases, the strength of the holding force on the substrate 102 increases. The gap 216 may be adjusted to ensure there is no deflection of the substrate 102.

FIG. 2B is a schematic, top view of the retaining device 200. The retaining device 200 includes the base plate 204, the stem 206, the suction pad 210, the plurality of arms 208 and the retention pads 212. In one embodiment, which can be combined with other embodiments described herein, the base plate 204 can be coupled to a surface via a plurality of through holes 219. For example, the plurality of through holes 219 allow the retaining device 200 to be coupled to a device operable to transfer and handle the substrate 102, such as a transfer robot.

The suction pad 210 includes a plurality of apertures 224. The plurality of apertures are in communication with the inlet 218. Therefore, air may be provided or removed via the plurality of apertures 224 to create a holding force on the substrate 102. For example, the holding force on the substrate may be created with a vacuum force applied through the plurality of apertures 224, such as by utilizing the Coandă effect.

In one embodiment, which can be combined with other embodiments described herein, the retaining device 200 includes a light source 220. The light source 220 is coupled to the retaining device 100. The light source 220 may provide light for additional processing of the substrate 102. For example, the light source 220 may provide light for a curing process, such as by providing an ultraviolet light beam to the substrate 102. The light source 220 may be utilized to provide lighting to the surrounding environment of the retaining device 200. In another embodiment, which can be combined with other embodiments described herein, the light source 220 is a ring light i.e., the light source 220 is a ring shape such that light is provided equally or substantially equally to the substrate 102.

In one embodiment, which can be combined with other embodiments described herein, the retaining device 200 includes a visual system 222. The visual system 222 includes a plurality of ports 223 disposed on the plurality of arms 208. The plurality of ports 223 are operable to house one or more devices such as one or more cameras or sensors. The visual system 222 may include a controller coupled to the plurality of ports 223. The controller may then facilitate operations of handling and transferring the substrate 102 utilizing the visual system 222. The one or more cameras housed in the plurality of ports 223 are operable to assist in metrology processes and to improve the positional accuracy when positioning the retention pads 212 around the substrate 102. The one or more sensors housed in the plurality of ports may be proximity sensors and are operable to communicate with the controller. For example, a sensor may communicate to the controller when the substrate 102 is retained by the retaining device 100. Although, FIG. 2B shows the visual system 222 with three of the plurality of ports 223, one or more of the plurality of ports 223 may be utilized. Any number of devices such as the one or more cameras and sensors may be utilized with the retaining device 200. Additionally, the plurality of ports 223 may be disposed on other portions of the retaining device 200, and are not limited to being disposed on the plurality of arms 208.

FIG. 3A is a schematic, perspective view of a retention pad 112, 212. The retention pad 112, 212 is operable to be utilized in the retaining device 100 or the retaining device 200 to contact a substrate 102. The retention pad 112, 212 is disposed on one of the plurality of arms 108, 208. The retention pad 112, 212 contacts the substrate 102 on an exclusion zone or inactive areas of the substrate 102.

In one embodiment, which can be combined with other embodiments described herein, the retention pad 112, 212 is configured to include a contact pad 114. The contact pad 114 provides friction and prevents lateral movement of the substrate 102. In one embodiment, which can be combined with other embodiments described herein, the contact pad 114 is a low contact friction pad located under the handling zone of the substrate 102. The contact pad 114 provides a vacuum force to the substrate 102 on the exclusion zones such that there is minimal damage to the active areas of the substrate 102. The contact pad 114 includes, but is not limited to, polymer materials such as a carbon filled polyetheretherketone (PEEK) material or an unfilled PEEK material.

FIG. 3B is a schematic, perspective view of a retention pad 112, 212. The retention pad 112, 212 is operable to be utilized in the retaining device 100 or the retaining device 200 to contact a substrate 102. The retention pad 112, 212 contacts the substrate 102 on an exclusion zone or inactive areas of the substrate 102.

In one embodiment, which can be combined with other embodiments described herein, the retention pad 112, 212 is configured to include a vacuum pad 302. The vacuum pad 302 may be utilized in place of the contact pad 114 (shown in FIGS. 1A, 1B, 2A, and 2B). The vacuum pad provides a vacuum force on the substrate 102. The vacuum pad 302 may be in communication with the inlet 118, 218. In another embodiment, which can be combined with other embodiments described herein, the vacuum pad has a diameter of about 1 mm. The vacuum pad 302 provides a vacuum force to the substrate 102 on the exclusion zones such that there is minimal damage to the active areas of the substrate 102.

Figure 4:
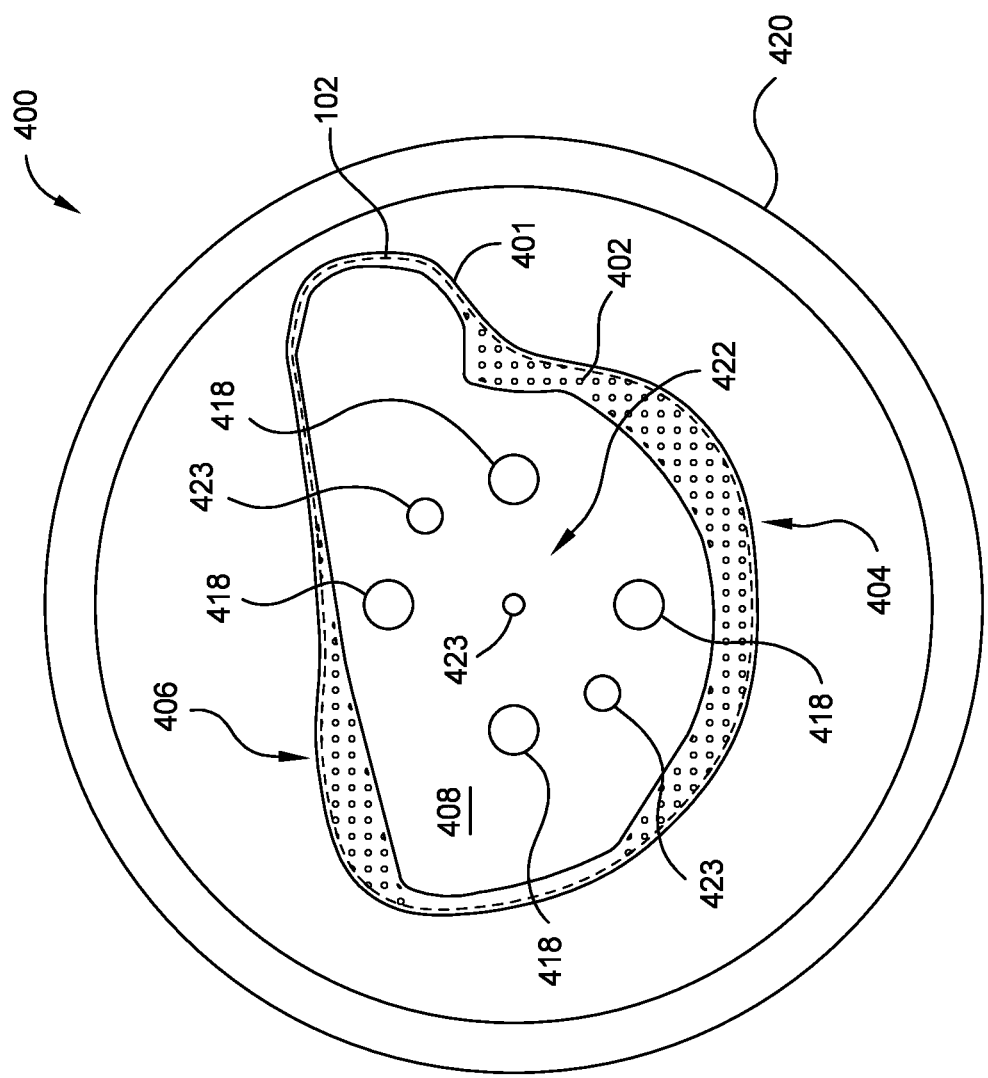
FIG. 4 is a schematic, top-view of a retaining device according to embodiments.

FIG. 4 is a schematic, top-view of a retaining device 400 according to embodiments described herein. The retaining device 400 is operable to retain a substrate 102. The retaining device 400 is operable to transfer and handle the substrate 102. Additionally, the retaining device 400 is operable to retain the substrate 102 during processing, such as in back end processing.

The retaining device 400 includes a ledge 402. The ledge 402 is disposed along a perimeter 401 of the retaining device 400. In one embodiment, which can be combined with other embodiments described herein, the ledge 402 is about 0.5 mm to about 1 mm wide. In one embodiment, which can be combined with other embodiments described herein, the substrate 102 is an optical device lens having a surface area of between about 18 $cm^2$ and about 20 $cm^2$. The retaining device 400 has a retention area defined by the perimeter 401. The retention area corresponds to the surface area of the optical device lens, such that the optical device lens is retained by the retaining device 400. The ledge 402 is operable to prevent lateral movement of the substrate 102. The substrate 102 sits on the ledge 402 such that the ledge 402 only contacts the exclusion zones of the substrate 102. The substrate 102 sits on the ledge 402 such that it is sufficiently flat. The retaining device 400 may have a matte finish on the ledge 402. The ledge 402 has a surface texture of about 1.6 µm to about 3.2 µm.

The ledge further includes vacuum zones 404. The vacuum zones 404 correspond to the exclusion zones of the substrate 102. The vacuum zones 404 further include a plurality of vacuum pins 406. The plurality of vacuum pins 406 may be machined. The plurality of vacuum pins 406 support the substrate 102 when placed on the ledge 402. The plurality of vacuum pins 406 are able to provide a vacuum force to the substrate 102. For example, the plurality of vacuum pins 406 are in communication with a vacuum source. Thus, the plurality of vacuum pins 406 provide a vacuum force to the substrate 102 to retain the substrate 102 on the ledge 402. In one embodiment, which can be combined with other embodiments described herein, the plurality of vacuum pins 406 have an encapsulation coating disposed thereover. The encapsulation coating protects the substrate 102 when contacting the plurality of vacuum pins 406. The encapsulation coating includes, but is not limited to, a polymide material, or other thermoset materials.

The retaining device 400 further includes a base plate 408. The base plate is recessed from the ledge 402. The base plate 408 is recessed such that sensitive portions of the substrate 102, such as the optical device structures and coatings, are not damaged during transfer or during handling by contacting the base plate 408. In one embodiment, which can be combined with other embodiments described herein, the base plate 408 can be coupled to a surface via a plurality of through holes 418. For example, the plurality of through holes 418 allow the retaining device 400 to be coupled to a device operable to transfer and handle the substrate 102, such as a transfer robot.

In one embodiment, which can be combined with other embodiments described herein, the retaining device 400 includes a light source 420. The light source 420 is coupled to the retaining device 400. The light source 420 may provide light for additional processing of the substrate 102. For example, the light source 420 may provide light for a curing process, such as by providing an ultraviolet light beam to the substrate 102. The light source 420 may be utilized to provide lighting to the surrounding environment of the retaining device 400. In another embodiment, which can be combined with other embodiments described herein, the light source 420 is a ring light i.e., the light source 420 is a ring shape such that light is provided equally or substantially equally to the substrate 102.

In one embodiment, which can be combined with other embodiments described herein, the retaining device 400 includes a visual system 422. The visual system 422 includes a plurality of ports 423 disposed on the base plate 408. The plurality of ports 423 are operable to house one or more devices such as one or more cameras or sensors. The visual system 422 may include a controller coupled to the plurality of ports 423. The controller may then facilitate operations of handling and transferring the substrate 102 utilizing the visual system 422. The one or more cameras housed in the plurality of ports 423 are operable to assist in metrology processes and to improve the positional accuracy when positioning the plurality of vacuum pins 406 on the substrate 102. The one or more sensors housed in the plurality of ports may be proximity sensors and are operable to communicate with the controller. For example, a sensor may communicate to the controller when the substrate 102 is retained by the retaining device 400. Although FIG. 4 shows the visual system 422 with three of the plurality of ports 423, one or more of the plurality of ports 423 may be utilized. Any number of devices such as the one or more cameras and sensors may be utilized with the retaining device 400. Additionally, the plurality of ports 423 may be disposed on other portions of the retaining device 400, and are not limited to being disposed on the base plate 408.

A method for retaining e.g., gripping, the substrate 102 with the retaining device 100 or 200 is described herein. At a first operation, a plurality of arms 108, 208 are adjusted depending on the geometry of the substrate 102. The plurality of arms 108, 208 are adjusted such that retention pads 112, 212 disposed on the plurality of arms 108, 208 contact corners or exclusion zones of a substrate 102. The retention pads 112, 212 define a retention area of the retaining device 100, 200. The retention area corresponds to a surface area of the substrate 102 to be retained. Adjusting the plurality of arms 108, 208 includes changing a radial distance 109, 209. At a second operation, a gap 116, 216 is adjusted. The gap 116, 216 is the length from the suction pad 110 to the second surface 105 of the substrate 102. The gap 116, 216 is adjusted to increase or decrease the holding force to be placed on a substrate 102 by a suction pad 110, 210. At a third operation, the substrate 102 is retained by the retaining device 100, 200. The substrate 102 is in contact with the retention pads 112, 212. Upon activation, the suction pad 110, 210 provides a holding force to the substrate 102. In one embodiment, which can be combined with other embodiments described herein, a light source 120, 220 and a visual system 122, 222 are utilized during the method to perform processes such as metrology, ultraviolet curing of the substrate 102, or improving the positional accuracy of retaining the substrate 102.

A method for retaining e.g., gripping, the substrate 102 with the retaining device 400 is described herein. At a first operation, a substrate 102 is placed on a ledge 402 of the retaining device 400. The ledge 402 is disposed along a perimeter 401 of the retaining device 400. The retaining device 400 has a retention area defined by the perimeter 401. The retention area corresponds to the surface area of the substrate 102 to be retained. A base plate 408 is recessed from the ledge 402 such that the substrate 102 is only contacted on exclusion zones. At a second operation, a plurality of vacuum pins 406 are activated. The plurality of vacuum pins 406 provide a holding force to the substrate 102 to retain the substrate 102 on the retaining device 400. In one embodiment, which can be combined with other embodiments described herein, a light source 420 and a visual system 422 are utilized during the method to perform processes such as metrology, ultraviolet curing of the substrate 102, or improving the positional accuracy of retaining the substrate 102.

In summation, devices and methods for retaining optical devices are shown and described herein. Retaining devices and methods for retaining the optical devices described herein provide for retention of the substrate without contacting sensitive portions of the substrate. For example, the optical device structures and coatings on the substrate are not damaged during transfer or during handling. Additionally, the retaining devices prevent deflection of the substrate. The retaining devices and methods of retaining the optical devices utilize corner contact or contact on the exclusion zones i.e., inactive areas of the substrate to retain the substrate and prevent the substrate from moving laterally. Additionally, a holding force retains the substrate in the vertical direction, without contacting the substrate. The retaining device described herein may be adjustable to account for multiple geometries of the substrate, therefore improving tool throughout and reducing errors when handling the substrates.

While the foregoing is directed to examples of the present disclosure, other and further examples of the disclosure may be devised without departing from the basic scope thereof, and the scope thereof is determined by the claims that follow.

What is claimed is:

1. A device, comprising:
   a base plate, the base plate coupled to a stem;
   a suction pad disposed on the stem, the suction pad operable to provide a holding force to a substrate to be retained;
   a plurality of arms directly coupled to the stem and extending radially from the stem and the suction pad, the plurality of arms coupled to a plurality of actuators, the actuators operable to move the plurality of arms in a lateral direction or a vertical direction; and
   a retention pad disposed on each of the plurality of arms.

2. The device of claim 1, further comprising an inlet, the inlet coupled to the stem, the inlet in communication with an air source and the suction pad.

3. The device of claim 2, wherein the suction pad includes a plurality of apertures in communication with the air source via the inlet, the plurality of apertures disposed through the suction pad.

4. The device of claim 1, wherein each of the retention pads contacts a corner of the substrate.

5. The device of claim 1, wherein a gap between the suction pad and the substrate to be retained is operable to be adjusted to increase or decrease the holding force to be placed on the substrate.

6. The device of claim 1, wherein a light source is coupled to the plurality of arms, wherein the light source forms a ring shape around the stem.

7. The device of claim 1, wherein a visual system is coupled to the plurality of arms, the visual system including one or more cameras coupled to a controller.

8. The device of claim 1, wherein a visual system is coupled to the plurality of arms, the visual system including one or more sensors coupled to a controller.

9. The device of claim 1, wherein the retention pad is configured to include a contact pad, the contact pad operable to contact a corner of the substrate when the substrate is retained.

10. The device of claim 1, wherein the retention pad is configured to include a vacuum pad, the vacuum pad operable to provide a vacuum force to an inactive portion of the substrate when the substrate is retained.

11. A method for retaining a substrate, comprising:
adjusting retention pads disposed on a plurality of arms of a retaining device, the retention pads adjusted to define a retention area corresponding to a surface area of the substrate to be retained with the retaining device, the plurality of arms directly coupled to the stem and extending radially from the stem and a suction pad, the suction pad operable to provide a holding force to the substrate;
adjusting a gap between the suction pad and the substrate to be retained; and
activating the suction pad to provide the holding force to the substrate to be retained.

12. The method of claim 11, wherein the retention pads contact corners of the substrate.

13. The method of claim 11, wherein the adjusting the gap between the suction pad and the substrate increases or decreases the holding force to be placed on the substrate.

14. The method of claim 11, further comprising providing a light beam to the substrate from a light source, wherein the light source is coupled to the plurality of arms, wherein the light source forms a ring shape around the stem.

15. The method of claim 11, wherein the retention pads provide a vacuum force to an inactive portion of the substrate when the substrate is retained.

16. The method of claim 11, further comprising performing a metrology process or a curing process with a light source or a visual system coupled to the retaining device.

* * * * *